United States Patent
Lin et al.

(10) Patent No.: US 9,349,451 B1
(45) Date of Patent: May 24, 2016

(54) RESISTIVE MEMORY AND REPAIRING METHOD THEREOF

(71) Applicant: Winbond Electronics Corp., Taichung (TW)

(72) Inventors: Meng-Hung Lin, Taichung (TW); Bo-Lun Wu, Changhua County (TW); Ting-Ying Shen, Chiayi (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/729,065

(22) Filed: Jun. 3, 2015

(30) Foreign Application Priority Data

Dec. 2, 2014 (TW) .............................. 103141781 A

(51) Int. Cl.
*G11C 11/00* (2006.01)
*G11C 5/14* (2006.01)
*G11C 13/00* (2006.01)

(52) U.S. Cl.
CPC .......... *G11C 13/0097* (2013.01); *G11C 13/004* (2013.01); *G11C 13/0033* (2013.01); *G11C 13/0069* (2013.01)

(58) Field of Classification Search
CPC ............... G11C 11/16; G11C 11/1675; G11C 11/5607; G11C 13/0011; G11C 13/003; G11C 13/0069; G11C 13/0097; G11C 2211/5615; G11C 11/1673; G11C 17/02; G11C 17/165; G11C 7/14; G11C 7/02; G11C 2213/72; G11C 2213/74; G11C 13/0007; G11C 13/004; G11C 13/0002; G11C 17/16; G11C 13/0028; G11C 13/0023; G11C 11/5678; G11C 11/5692; G11C 13/0064; G11C 17/00; G11C 17/18; G11C 2013/0054

See application file for complete search history.

(56) References Cited

U.S. PATENT DOCUMENTS

| 8,804,401 B2 | 8/2014 | Sugimae et al. | |
|---|---|---|---|
| 8,891,293 B2 | 11/2014 | Du et al. | |
| 2010/0091559 A1* | 4/2010 | Parkinson | G11C 13/0004 365/163 |
| 2010/0103722 A1* | 4/2010 | Nirschl | G11C 13/0004 365/163 |
| 2010/0309716 A1* | 12/2010 | Tsukada | G11C 5/145 365/163 |
| 2012/0327708 A1 | 12/2012 | Du et al. | |

FOREIGN PATENT DOCUMENTS

TW 201301286 1/2013

OTHER PUBLICATIONS

"Office Action of Taiwan Counterpart Application", issued on Dec. 28, 2015, pp. 1-6, in which the listed foreign reference was cited.

* cited by examiner

*Primary Examiner* — Hien Nguyen
(74) *Attorney, Agent, or Firm* — Jianq Chyun IP Office

(57) ABSTRACT

A resistive memory and a repairing method of the resistive memory are provided. Steps of the repairing method includes: operating a plurality of set-reset cycles on the resistive memory; detecting whether the resistive memory encounters an over-set issue after the set-reset cycles are operated; if the resistive memory encounters the over-set issue, executing an enhanced reset programming on the resistive memory. Here, the enhanced reset programming is executed by applying an enhanced reset voltage on the resistive memory during an enhanced reset time period. A product of the enhanced reset voltage and the enhanced reset time period is larger than a product of a reset voltage and a reset time period.

12 Claims, 3 Drawing Sheets

RESISTIVE MEMORY AND REPAIRING METHOD THEREOF

CROSS-REFERENCE TO RELATED APPLICATION

This application claims the priority benefit of Taiwan application serial no. 103141781, filed on Dec. 2, 2014. The entirety of the above-mentioned patent application is hereby incorporated by reference herein and made a part of this specification.

BACKGROUND

1. Field of the Invention

The invention relates to a repairing method of a resistive memory; more particularly, the invention relates to a repairing method of a resistive memory if the resistive memory encounters an over-set issue.

2. Description of Related Art

Recent transitional-metal-oxide-based resistive memories have simple structures and can be mass produced effectively. In addition, among the next-generation non-volatile memories, the resistive memories characterized by low operating voltages can be practically applied to electronic products.

To guarantee the favorable electrical properties and the data retention capabilities of the resistive memory, the execution of a forming programming, a set programming, and a reset programming plays a crucial role. Voltages applied for executing the forming, set, and reset programmings are optimized, so as to improve yield of the resistive memory. During the inspection on the conventional resistive memory, the resistive memory frequently encounters an over-set issue after set-reset cycles are operated, which may result in the failure of a chip of the resistive memory to pass the inspection. Accordingly, how to repair the resistive memory that encounters the over-set issue to improve the production yield of the resistive memory draws attention from engineers in the pertinent field.

SUMMARY OF THE INVENTION

The invention is directed to a repairing method of a resistive memory. Specifically, by applying the repairing method, the resistive memory that encounters an over-set issue can be effectively repaired.

The invention is further directed to a resistive memory that can be effectively repaired after encountering an over-set issue.

In an embodiment of the invention, a repairing method of a resistive memory includes following steps. Plural set-reset cycles are operated on the resistive memory. Here, each of the set-reset cycles includes a set programming and a reset programming, a set voltage is applied on the resistive memory during a set time period to execute the set programming, and a reset voltage is applied on the resistive memory during a reset time period to execute the reset programming. After the set-reset cycles are operated, whether the resistive memory encounters an over-set issue is determined. If the resistive memory encounters the over-set issue, an enhanced reset programming is executed on the resistive memory. Here, the enhanced reset programming is executed by applying an enhanced reset voltage on the resistive memory during an enhanced reset time period, and a product of the enhanced reset voltage and the enhanced reset time period is larger than a product of a reset voltage and a reset time period.

In an embodiment of the invention, a resistive memory that includes a resistive memory cell array, a sensing amplifier, and a voltage provider is provided. The resistive memory cell array includes a plurality of resistive memory cells. The sensing amplifier is coupled to the resistive memory cells through a plurality of bit lines and detects whether the resistive memory encounters an over-set issue. The voltage provider is coupled to the sensing amplifier and coupled to a plurality of source lines of the resistive memory cell array, and the voltage provider executes a reset programming by applying a reset voltage on the resistive memory during a reset time period. If the resistive memory encounters the over-set issue, the voltage provider executes an enhanced reset programming by applying an enhanced reset voltage on the resistive memory during an enhanced reset time period, and a product of the enhanced reset time period and the enhanced reset voltage is larger than a product of the reset time period and the reset voltage.

In view of the above, after the set-reset cycles are operated on the resistive memory, whether the resistive memory encounters the over-set issue is detected. If the resistive memory encounters the over-set issue, the enhanced reset programming is executed on the resistive memory (which encounters the over-set issue) by providing larger energy, and the set condition of the resistive memory can be released, such that the yield of the resistive memory can be improved.

Several exemplary embodiments accompanied with figures are described in detail below to further describe the invention in details.

DETAILED DESCRIPTION OF DISCLOSED EMBODIMENTS

Figure 1:
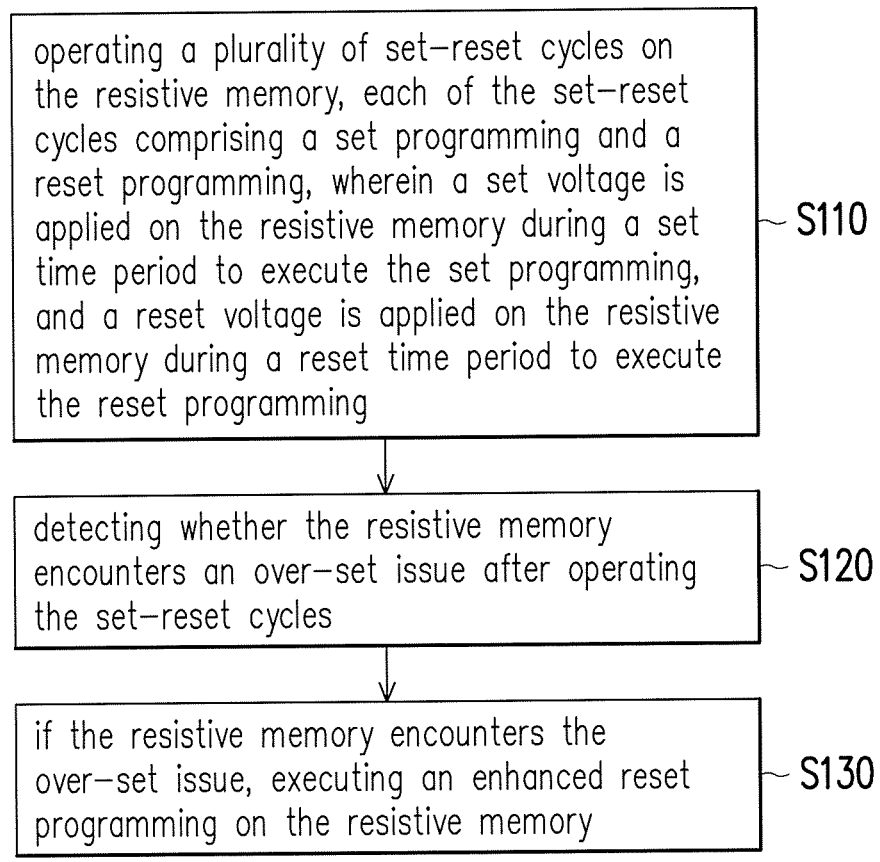
FIG. 1 is a flow chart of a repairing method of a resistive memory according to an embodiment of the invention.

Please refer to FIG. 1, which is a flow chart of a repairing method of a resistive memory according to an embodiment of the invention. As shown in FIG. 1, during an inspection of the resistive memory, plural set-reset cycles can be operated on the resistive memory in step S110. Here, one single set-reset cycle can be completed by operating one single set programming and one single reset programming. The set programming is executed by applying a set voltage on bit lines of each memory cell in the resistive memory during a set time period. By contrast, the reset programming is executed by applying a reset voltage on source lines of each memory cell in the resistive memory during a reset time period. The set time period and the reset time period sequentially occur within one action cycle.

As described above, the reset voltage can be greater than the set voltage; for instance, in the present embodiment, the reset voltage can be 2.6V or 4.0V, while the set voltage can be 2.0V or 3.3V. Certainly, the reset voltage and the set voltage can be determined by designers according to actual properties of the resistive memory and should not be limited to those described herein.

To be specific, in the set state, the resistance of the resistive memory cells can be reduced; by contrast, in the reset state, the resistance of the resistive memory cells can be increased.

Besides, in the set-reset cycles described in the present embodiment, the set voltage applied on the resistive memory remains unchanged. In addition, in one set-reset cycle, the set programming and the reset programming can be executed consecutively.

In step S120, after the set-reset cycles are operated on the resistive memory, whether the resistive memory encounters an over-set issue is detected. When the resistive memory is in the over-set state, applying the reset voltage to execute the reset programming on the resistive memory cells cannot change the resistance of the resistive memory from low to high, and this is the so-called over-set issue. That is, the resistive memory cells in the over-set state are limited to have the low resistance and can no longer have the high resistance, and the resistive memory encountering the over-set issue cannot function as usual.

In order to repair the resistive memory cells in the over-set state, in step S130, an enhanced reset programming is executed on the resistive memory. Note that the enhanced reset programming is executed by applying the enhanced reset voltage on the source lines of the resistive memory cells during an enhanced reset time period, and a product of the enhanced reset time period and the enhanced reset voltage is larger than a product of the reset time period and the reset voltage.

Simply put, the enhanced reset programming is executed by executing the normal reset programming on the resistive memory with greater power than that required for executing the normal reset programming. Practically, the enhanced reset voltage greater than the normal reset voltage applied for executing the normal reset programming cab be applied; alternatively, the enhanced reset programming can be executed during an enhanced reset time period. Here, the enhanced reset time period is longer than the normal reset time period during which the normal reset programming is executed.

For instance, the enhanced reset voltage is 1.5-2 times the normal reset voltage. The enhanced reset time period can be 100-1000 times the reset time period during which the normal reset programming is executed.

After said enhanced reset programming is executed, the resistive memory cells encountering the over-set issue can again have the high resistance and can be provided for the normal reading and writing operations. As such, the production yield of the resistive memory can be enhanced.

Figure 2:
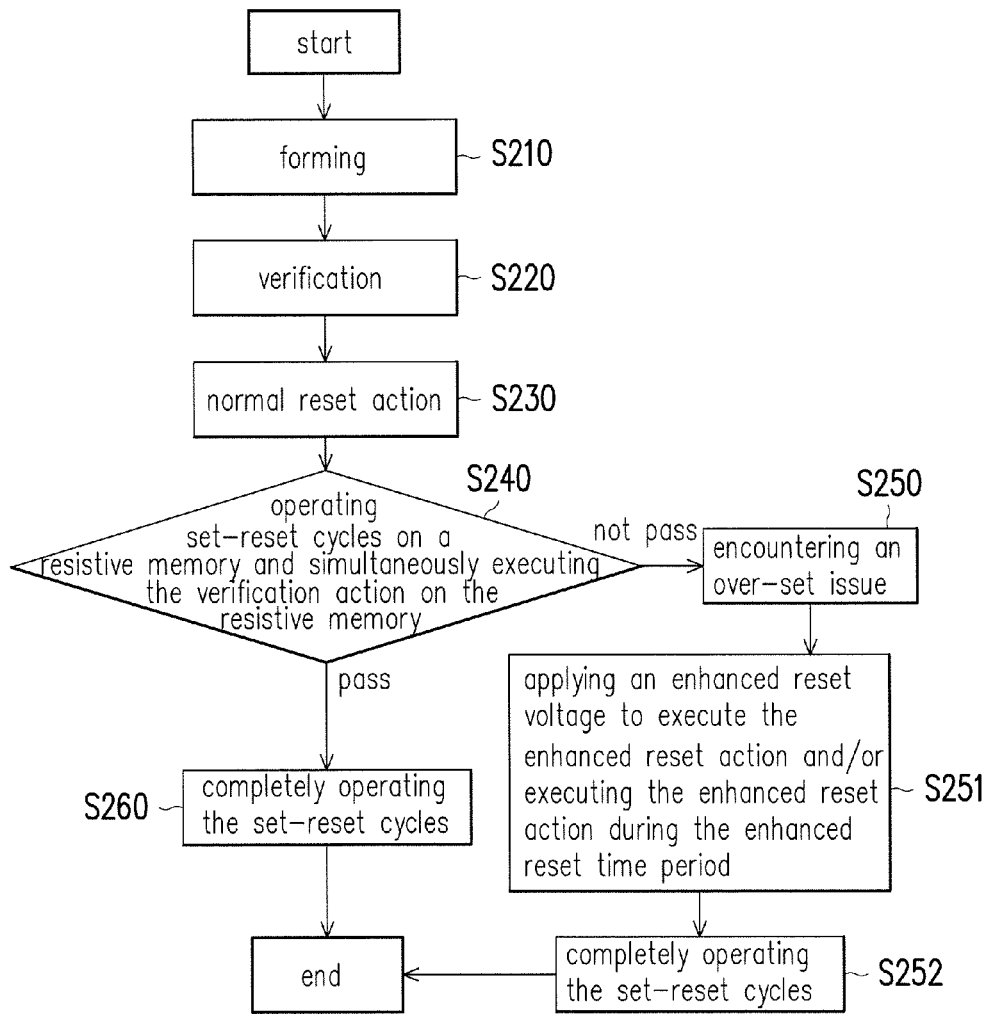
FIG. 2 is a flow chart of inspecting a resistive memory according to an embodiment of the invention.

Please refer to FIG. 2, which is a flow chart of inspecting a resistive memory according to an embodiment of the invention. In step S210, a forming programming is executed on the resistive memory. The forming programming is executed by applying a relatively high bias voltage on the resistive memory, such that soft breakdown of the resistive memory may arise. After the forming programming is executed, the resistive memory cells can switch the resistance of the resistive memory between low and high according to the set programming and the reset programming, so as to provide the data writing and reading functions.

In step S220, a verification action is executed on the resistive memory; in step S230, a normal reset programming is executed on the resistive memory. In step S240, plural set-reset cycles are operated on the resistive memory, and simultaneously the verification action is executed on the resistive memory. During verification, whether the resistive memory encounters the over-set issue can be determined. If the resistive memory does not pass the verification, it indicates that the resistive memory encounters the over-set issue (step S250); if the resistive memory passes the verification, it indicates that the resistive memory does not encounter the over-set issue, and that the set-reset cycles are effectively operated (step S260). The inspection is then ended.

If the resistive memory encounters the over-set issue, in order to repair the resistive memory, an enhanced reset programming can be executed on the resistive memory cells (encountering the over-set issue) by applying the enhanced reset voltage to execute the enhanced reset programming and/or executing the enhanced reset programming during the enhanced reset time period in step S251. After the enhanced reset programming is executed in step S251, the resistive memory cells encountering the over-set issue can again have the high resistance, and the set-reset cycles are operated in step S252, so as to complete the inspection.

Figure 3A:
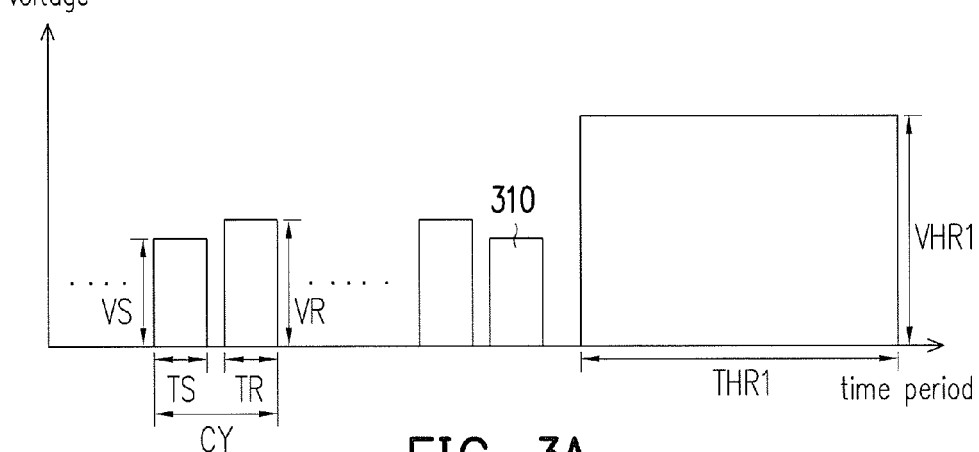
FIG. 3A is a schematic diagram illustrating a waveform of an enhanced reset programming according to an embodiment of the invention.

Please refer to FIG. 3A, which is a schematic diagram illustrating a waveform of an enhanced reset programming according to an embodiment of the invention. In FIG. 3A, during the set time period TS, the set voltage VS is applied to execute the set programming on the resistive memory, and the reset voltage VR is applied to execute the reset programming on the resistive memory during the reset time period TR. The continuous set and reset programmings can be considered as one set-reset cycle CY. After plural set-reset cycles CY are operated, if the resistive memory encounters the over-set issue, after the set programming 310 is executed, the enhanced reset voltage VHR1 may be applied during the enhanced reset time period THR1 on the source lines of the resistive memory cells encountering the over-set issue, so as to execute the enhanced reset programming.

The enhanced reset voltage VHR1 may be greater than the reset voltage VR, the enhanced reset time period THR1 may be longer than the reset time period TR, or both of the above are met.

Figure 3B:
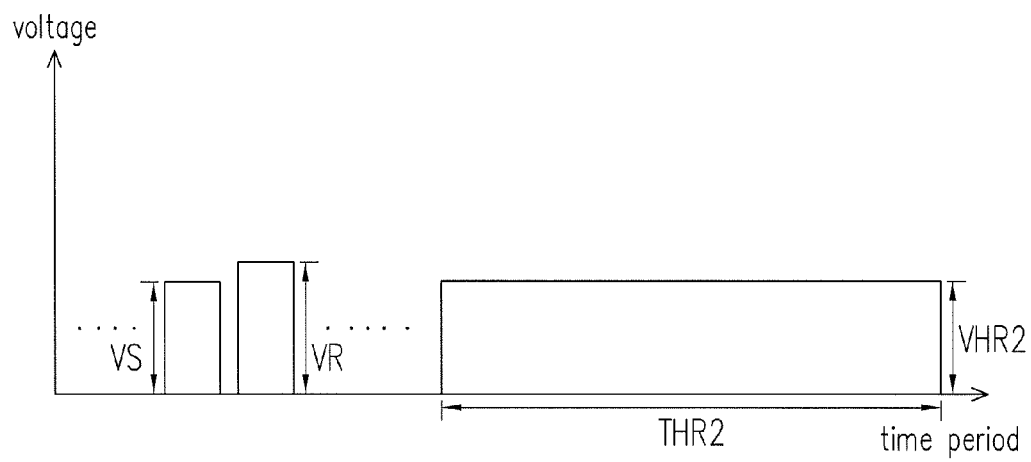
FIG. 3B is a schematic diagram illustrating a waveform of an enhanced reset programming according to another embodiment of the invention.

Please refer to FIG. 3B, which is a schematic diagram illustrating a waveform of an enhanced reset programming according to another embodiment of the invention. In FIG. 3B, after plural set-reset cycles are operated, if the resistive memory encounters the over-set issue, during the enhanced reset time period THR2, the enhanced reset voltage VHR2 may be applied on the source lines of the resistive memory cells encountering the over-set issue, so as to execute the enhanced reset programming. Compared to the embodiment shown in FIG. 3A, the present embodiment discloses that the enhanced reset voltage VHR2 may be less than the enhanced reset voltage VHR1; what is more, the enhanced reset voltage VHR2 may be less than the reset voltage VR. The enhanced reset time period THR2 may be longer than the enhanced reset time period THR1.

Figure 4:
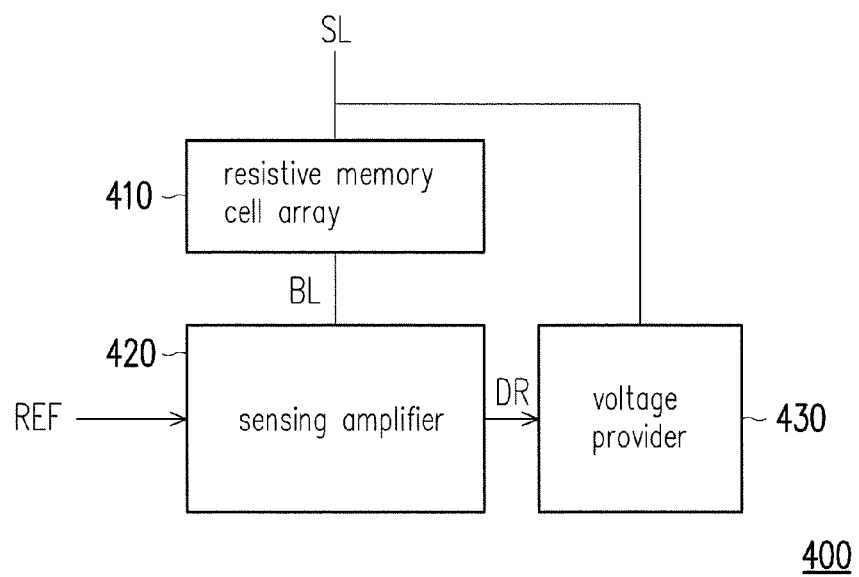
FIG. 4 is a schematic diagram of a resistive memory according to an embodiment of the invention.

Please refer to FIG. 4, which is a schematic diagram of a resistive memory according to an embodiment of the invention. The resistive memory 400 includes a resistive memory cell array 410, a sensing amplifier 420, and a voltage provider 430. The resistive memory cell array 410 includes a plurality of resistive memory cells, is coupled to the sensing amplifier 420 through a plurality of bit lines BL, and is coupled to the voltage provider 430 through a plurality of source lines SL.

In the present embodiment, the sensing amplifier 420 may detect whether the resistive memory cells in the resistive memory cell array 410 encounters the over-set issue by the current on at least one of the bit lines BL. Specifically, if the sensing amplifier 420 detects the current on at least one of the bit lines BL is less than a predetermined reference current, the sensing amplifier 420 determines the resistive memory cells encounter the over-set issue.

The sensing amplifier 420 may set the value of the reference current based on a reference signal REF. Besides, the sensing amplifier 420 may inform the voltage provider 430 of whether the inspected resistive memory encounters the over-set issue through a detection signal DR.

As to the implementation details of the sensing amplifier 420, the circuits of all sensing amplifiers known to people having ordinary skill in the pertinent art are applicable herein, and the invention is not limited thereto.

The voltage provider 430 may decide whether to execute the enhanced reset programming based on the detection signal DR. If the detection signal DR indicates that the resistive memory encounters the over-set issue, the voltage provider 430 generates the enhanced reset voltage and applies the enhanced reset voltage on the source lines SL of the resistive memory cells during the enhanced reset time period.

Certainly, if the detection signal DR indicates that the resistive memory does not encounter the over-set issue, the voltage provider 430 need not execute the enhanced reset programming.

The implementation details of executing the enhanced reset programming are already described above and thus will not be further explained.

To sum up, if the resistive memory described herein encounters the over-set issue, the enhanced reset programming is executed on the resistive memory, so as to release the set condition of the resistive memory and ensure that the resistive memory cells can function effectively. In addition, the production yield of the resistive memory cells can be improved in an effective manner.

What is claimed is:

1. A repairing method of a resistive memory, comprising:
    operating a plurality of set-reset cycles on the resistive memory, each of the set-reset cycles comprising a set programming and a reset programming, wherein a set voltage is applied on the resistive memory during a set time period to execute the set programming, and a reset voltage is applied on the resistive memory during a reset time period to execute the reset programming;
    detecting whether the resistive memory encounters an over-set issue after operating the set-reset cycles; and
    if the resistive memory encounters the over-set issue, executing an enhanced reset programming on the resistive memory,
    wherein the enhanced reset programming is executed by applying an enhanced reset voltage on the resistive memory during an enhanced reset time period, and a product of the enhanced reset time period and the enhanced reset voltage is larger than a product of the reset time period and the reset voltage.

2. The repairing method of claim 1, wherein the enhanced reset time period is longer than the reset time period.

3. The repairing method of claim 2, wherein the enhanced reset time period is 100-1000 times the reset time period.

4. The repairing method of claim 1, wherein the enhanced reset voltage is greater than the reset voltage.

5. The repairing method of claim 4, wherein the enhanced reset voltage is 1.5-2 times the reset voltage.

6. The repairing method of claim 1, wherein the step of detecting whether the resistive memory encounters the over-set issue after operating the set-reset cycles comprises:
    detecting whether a read current on at least one bit line of the resistive memory is less than a predetermined reference current.

7. The repairing method of claim 1, wherein if the enhanced reset time period is longer than the reset time period, the enhanced reset voltage is less than the reset voltage.

8. A resistive memory comprising:
    a resistive memory cell array comprising a plurality of resistive memory cells;
    a sensing amplifier coupled to the resistive memory cells through a plurality of bit lines, the sensing amplifier detecting whether the resistive memory encounters an over-set issue; and
    a voltage provider coupled to the sensing amplifier and coupled to a plurality of source lines of the resistive memory cell array, the voltage provider executing a reset programming by applying a reset voltage on the resistive memory during a reset time period,
    wherein if the resistive memory encounters the over-set issue, the voltage provider executes an enhanced reset programming by applying an enhanced reset voltage on the resistive memory during an enhanced reset time period, and a product of the enhanced reset time period and the enhanced reset voltage is larger than a product of the reset time period and the reset voltage.

9. The resistive memory of claim 8, wherein the sensing amplifier detects whether the reading current on at least one of the bit lines is less than a predetermined reference current, so as to determine whether the resistive memory encounters the over-set issue.

10. The resistive memory of claim 8, wherein the enhanced reset voltage is greater than the reset voltage.

11. The resistive memory of claim 8, wherein the enhanced reset time period is longer than the reset time period.

12. The resistive memory of claim 8, wherein if the enhanced reset time period is longer than the reset time period, the enhanced reset voltage is less than the reset voltage.

* * * * *